United States Patent
Yang

(10) Patent No.: US 12,224,335 B2
(45) Date of Patent: Feb. 11, 2025

(54) SEMICONDUCTOR DEVICE AND FABRICATION METHOD THEREOF

(71) Applicant: UNITED MICROELECTRONICS CORP., Hsin-Chu (TW)

(72) Inventor: Ching-Chung Yang, Hsinchu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 248 days.

(21) Appl. No.: 17/867,640

(22) Filed: Jul. 18, 2022

(65) Prior Publication Data
US 2023/0411495 A1  Dec. 21, 2023

(30) Foreign Application Priority Data
Jun. 20, 2022  (CN) .................. 202210696460.7

(51) Int. Cl.
*H01L 29/66* (2006.01)
*H01L 21/265* (2006.01)
*H01L 21/266* (2006.01)
*H01L 29/78* (2006.01)

(52) U.S. Cl.
CPC ........ *H01L 29/6656* (2013.01); *H01L 21/266* (2013.01); *H01L 29/66492* (2013.01); *H01L 29/7833* (2013.01); *H01L 21/26513* (2013.01)

(58) Field of Classification Search
CPC .............. H01L 29/6656; H01L 21/266; H01L 29/66492; H01L 29/7833; H01L 21/26513; H01L 29/66568; H01L 21/28035; H01L 29/42356; H01L 29/78
See application file for complete search history.

(56) References Cited

U.S. PATENT DOCUMENTS

| | | | |
|---|---|---|---|
| 9,728,616 B2 | 8/2017 | Hsiao | |
| 2014/0264588 A1* | 9/2014 | Chen ..................... | H01L 29/402 438/286 |
| 2021/0384344 A1* | 12/2021 | Steinmann .......... | H01L 29/7833 |

* cited by examiner

*Primary Examiner* — David Vu
(74) *Attorney, Agent, or Firm* — Winston Hsu

(57) ABSTRACT

A semiconductor device includes a substrate of first conductivity type; a first heavily doped region and a second heavily doped region of second conductivity type spaced apart from the first heavily doped region, located in the substrate; a channel region in the substrate and between the first heavily doped region and the second heavily doped region; a gate disposed on the channel region; a hard mask layer covering a top surface and a sidewall of the gate; and a spacer disposed on a sidewall of the hard mask layer.

14 Claims, 3 Drawing Sheets

SEMICONDUCTOR DEVICE AND FABRICATION METHOD THEREOF

BACKGROUND OF THE INVENTION

1. Field of the Invention

The present invention relates to the field of semiconductor technology, in particular to a semiconductor device and a fabrication method thereof.

2. Description of the Prior Art

As the semiconductor manufacturing process evolves, the chip size is getting smaller and smaller, and the width of the spacer next to the gate is also shrinking. This affects the performance of the medium-voltage devices, exacerbates the gate-induced drain leakage (GIDL) effect, and increases the leakage current (IoT) variation.

Therefore, there is still a need in the technical field for an improved semiconductor medium-voltage device and a manufacturing method, which can solve the GIDL effect caused by the shrinking of the device size.

SUMMARY OF THE INVENTION

It is one object of the present invention to provide an improved semiconductor device and a method of fabricating the same in order to solve the above-mentioned prior art deficiencies or shortcomings.

One aspect of the invention provides a semiconductor device including a substrate of a first conductivity type; a first heavily doped region of a second conductivity type in the substrate; a second heavily doped region of the second conductivity type spaced apart from the first heavily doped region, located in the substrate; a channel region in the substrate and between the first heavily doped region and the second heavily doped region; a gate disposed on the channel region; a hard mask layer covering a top surface and a sidewall of the gate; and a spacer disposed on a sidewall of the hard mask layer.

According to some embodiments, the hard mask layer comprises a silicon nitride layer.

According to some embodiments, the silicon nitride layer has a thickness of about 200 angstroms.

According to some embodiments, the hard mask layer further comprises a silicon oxide layer.

According to some embodiments, the silicon oxide layer has a thickness of about 700 angstroms.

According to some embodiments, the gate is a polysilicon gate.

According to some embodiments, the spacer comprises a silicon nitride spacer.

According to some embodiments, the spacer further comprises a silicon oxide spacer.

According to some embodiments, the semiconductor device further includes a well of the first conductivity type in the substrate; a first drift region of the second conductivity type disposed in the well, wherein the first heavily doped region is disposed in the first drift region and is in proximity to the spacer; and a second drift region of the second conductivity type disposed in the well, wherein the second heavily doped region is disposed in the second drift region and is in proximity to the spacer.

According to some embodiments, the first conductivity type is P type and the second conductivity type is N type.

Another aspect of the invention provides a method of fabricating a semiconductor device. A substrate of a first conductivity type is provided. A first heavily doped region of a second conductivity type is formed in the substrate. A second heavily doped region of the second conductivity type spaced apart from the first heavily doped region is formed in the substrate. A channel region is formed in the substrate and between the first heavily doped region and the second heavily doped region. A gate is formed on the channel region. A hard mask layer is formed to cover a top surface and a sidewall of the gate. A spacer is formed on a sidewall of the hard mask layer.

According to some embodiments, the hard mask layer comprises a silicon nitride layer.

According to some embodiments, the silicon nitride layer has a thickness of about 200 angstroms.

According to some embodiments, the hard mask layer further comprises a silicon oxide layer.

According to some embodiments, the silicon oxide layer has a thickness of about 700 angstroms.

According to some embodiments, the gate is a polysilicon gate.

According to some embodiments, the spacer comprises a silicon nitride spacer.

According to some embodiments, the spacer further comprises a silicon oxide spacer.

According to some embodiments, the method further includes the steps of forming a well of the first conductivity type in the substrate; forming a first drift region of the second conductivity type in the well, wherein the first heavily doped region is disposed in the first drift region and is in proximity to the spacer; and forming a second drift region of the second conductivity type disposed in the well, wherein the second heavily doped region is disposed in the second drift region and is in proximity to the spacer.

According to some embodiments, the first conductivity type is P type and the second conductivity type is N type.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Please refer to FIG. 1 to FIG. 6, which are schematic diagrams of a method for fabricating a semiconductor device 10 according to an embodiment of the present invention.

According to an embodiment of the present invention, the semiconductor device 10 may be a semiconductor medium-voltage device, for example, a medium-voltage device operated under a voltage range of 6-12V. Although the following embodiments are described by taking NMOS transistors as an example, those skilled in the art should understand that the present invention can also be applied to PMOS transistors.

Figure 1:
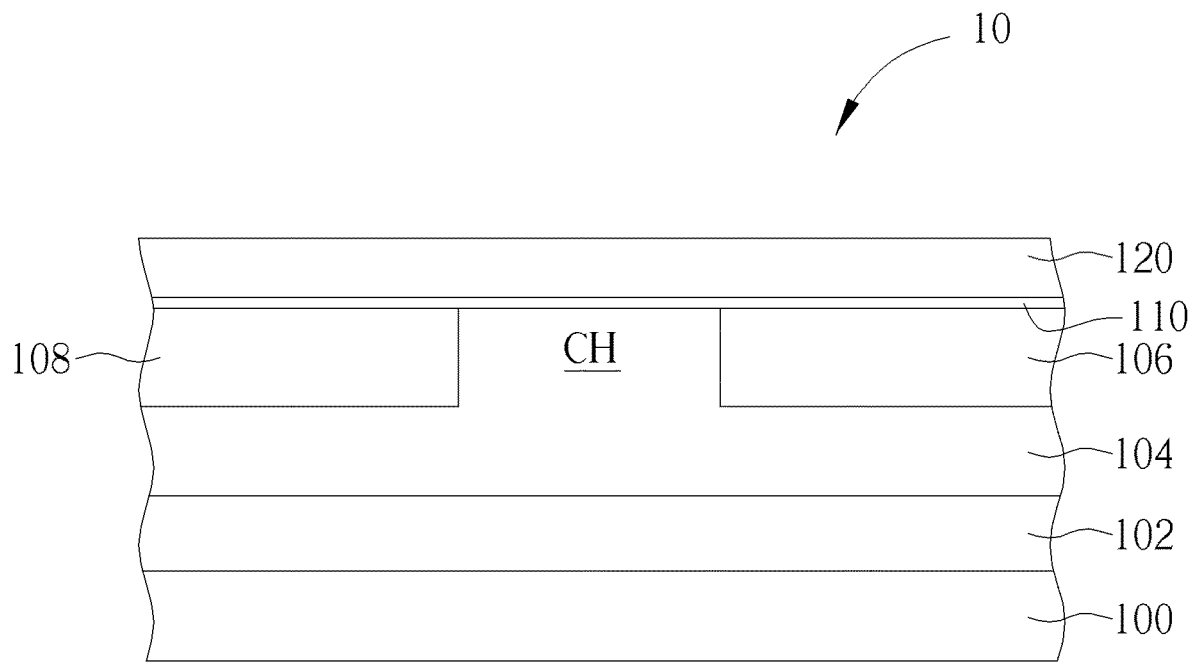
FIG. 1 to FIG. 6 are schematic diagrams illustrating a method of fabricating a semiconductor device according to an embodiment of the present invention.

As shown in FIG. 1, a substrate 100 having a first conductivity type, such as, but not limited to, a silicon substrate is first provided. According to an embodiment of the present invention, for example, the first conductivity type may be a P type. According to an embodiment of the present invention, a deep well 102 of the second conductivity type, for example, a deep N-type well, may be optionally formed in the substrate 100. According to an embodiment of the present invention, a well 104 of the first conductivity type, for example, a P-type well, may be formed in the deep well 102.

Next, a first drift region 106 with the second conductivity type and a second drift region 108 with the second conductivity type can be formed in the well 104. For example, the second conductivity type is N-type. The first drift region 106 and the second drift region 108 may be N-type drift regions. According to an embodiment of the present invention, a channel region CH is defined between the first drift region 106 and the second drift region 108. Next, a gate dielectric layer 110 and a polysilicon layer 120 are sequentially formed on the substrate 100. According to an embodiment of the present invention, for example, the gate dielectric layer 110 may be a silicon oxide layer.

Figure 2:
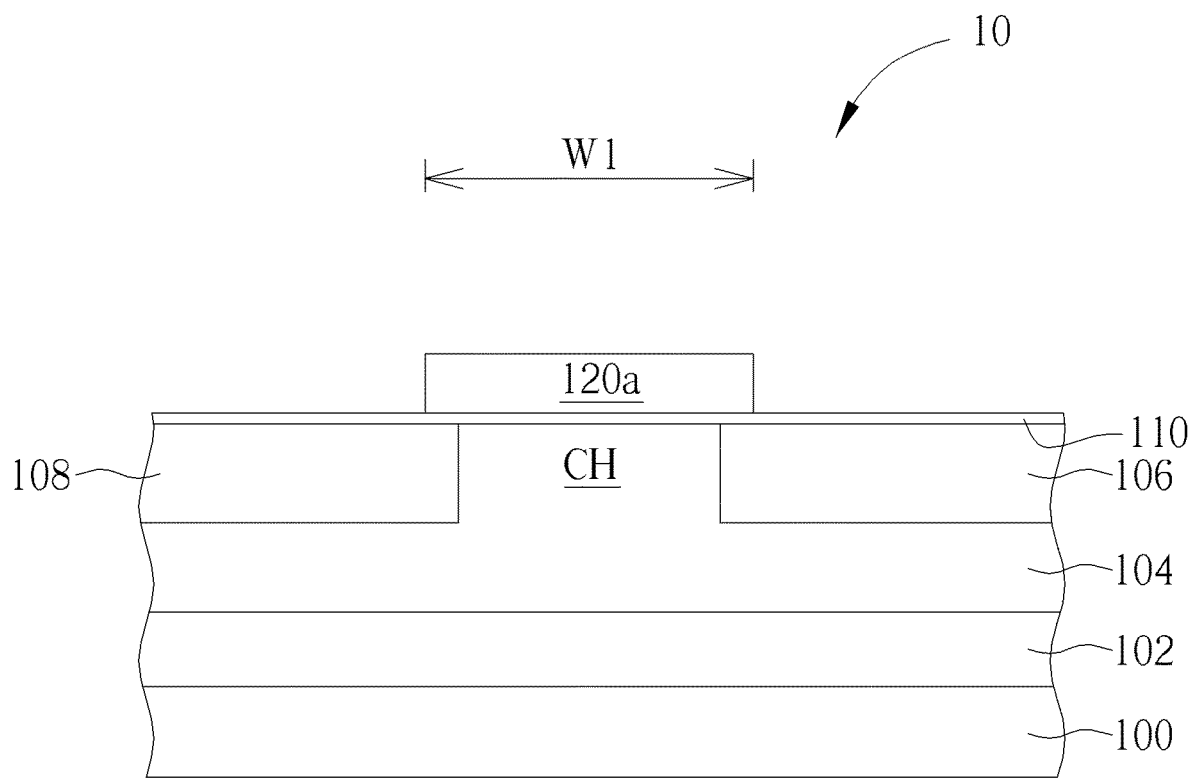

As shown in FIG. 2, next, a photolithography process and an etching process are performed to pattern the polysilicon layer 120 to form a polysilicon gate 120a on the channel region CH. According to an embodiment of the present invention, the gate 120a has a width W1.

Figure 3:
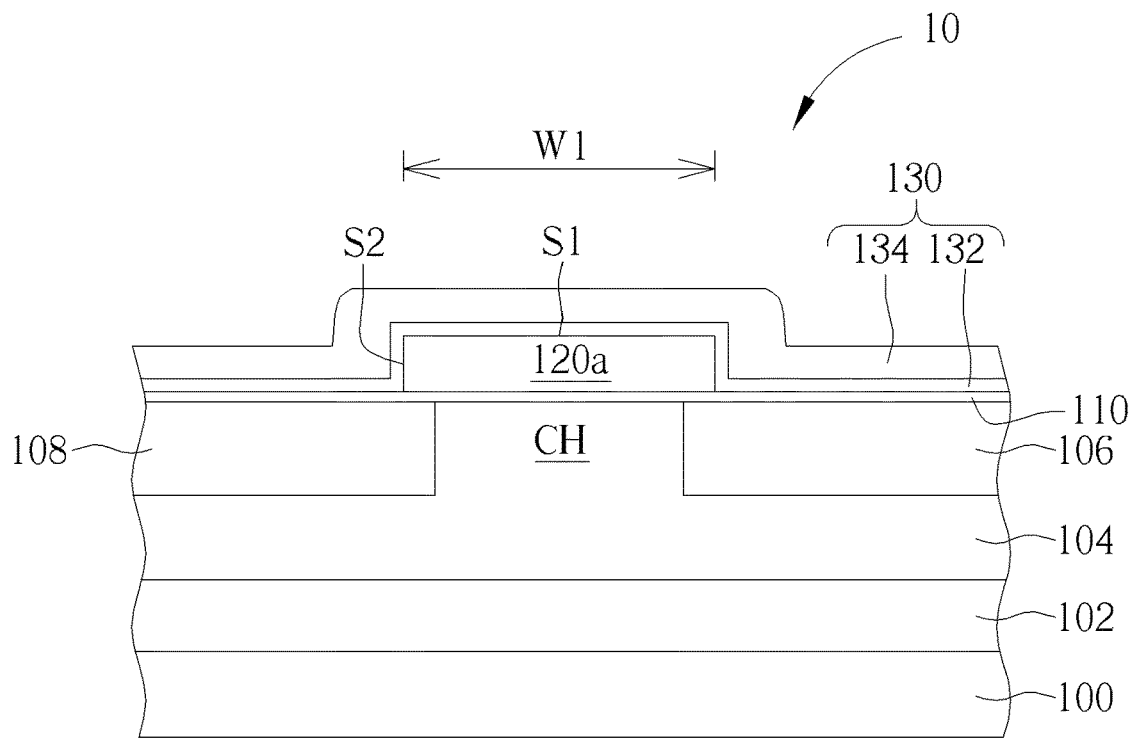

As shown in FIG. 3, next, a hard mask layer 130 is formed on the substrate 100 to cover the top surface S1 and the sidewall S2 of the gate 120a. According to an embodiment of the present invention, the hard mask layer 130 may include a silicon nitride layer 132. According to an embodiment of the present invention, for example, the thickness of the silicon nitride layer 132 is about 200 angstroms. According to an embodiment of the present invention, the hard mask layer 130 may further include a silicon oxide layer 134. According to an embodiment of the present invention, for example, the thickness of the silicon oxide layer 134 is about 700 angstroms.

Figure 4:
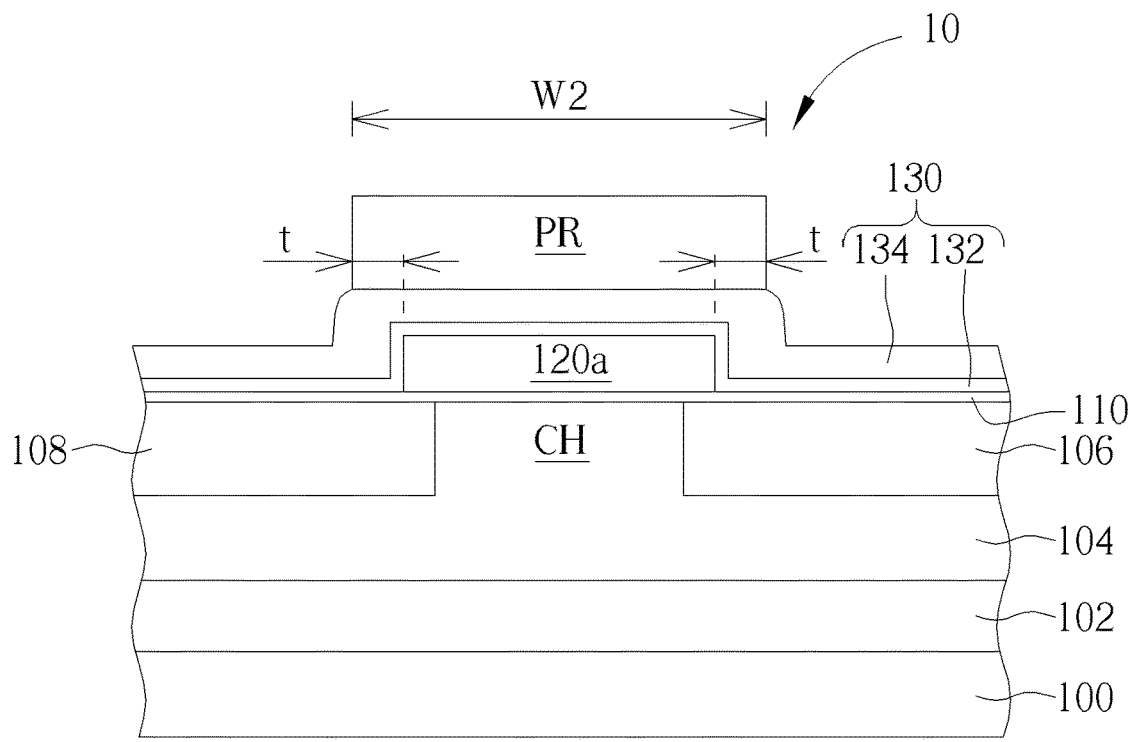

As shown in FIG. 4, next, a photoresist pattern PR is formed on the hard mask layer 130, which is located directly above the gate 120a. According to an embodiment of the present invention, the photoresist pattern PR has a width W2. The width W2 of the photoresist pattern PR is greater than the width W1 of the gate 120a. According to an embodiment of the present invention, both sides of the photoresist pattern PR extend beyond the two sides of the gate 120a by the width t, which may range between 0.05-0.09 m.

Figure 5:
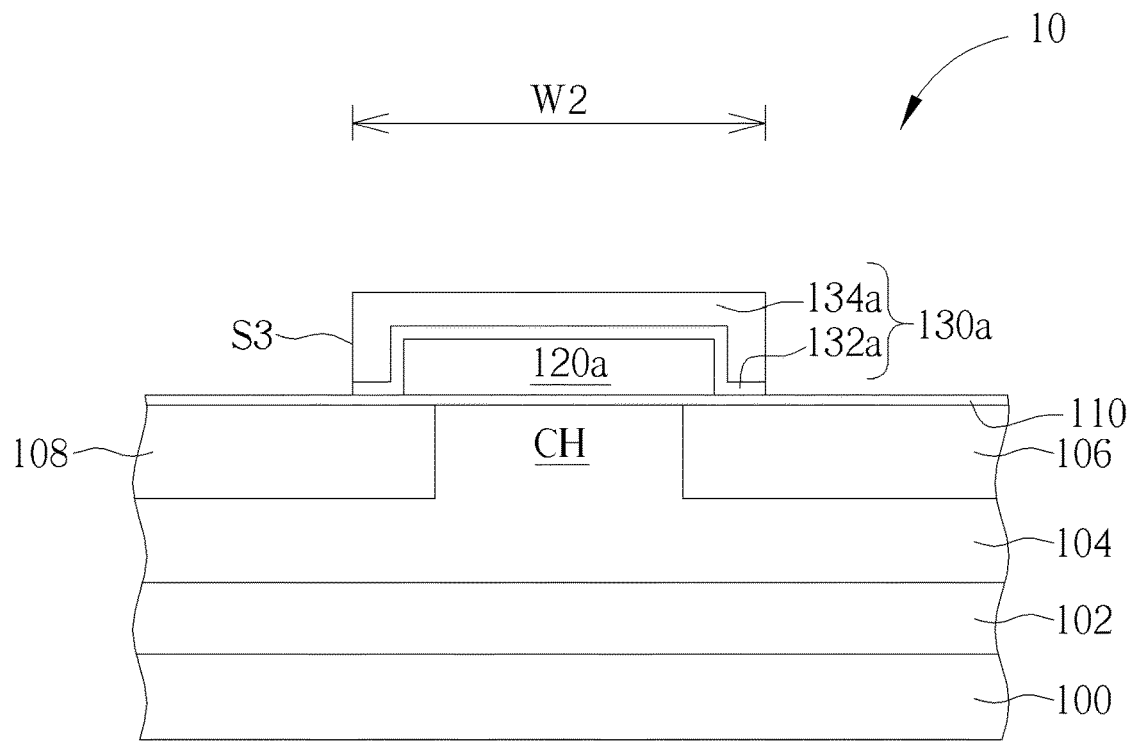

As shown in FIG. 5, an etching process is then performed to remove the hard mask layer 130 not covered by the photoresist pattern PR, so that the remaining hard mask layer 130a including the remaining silicon nitride layer 132a and the remaining hard mask layer 130a covers the top surface S1 and the sidewall S2 of the gate 120a. According to an embodiment of the present invention, the hard mask layer 130a has sidewalls S3. According to an embodiment of the present invention, the sidewalls S3 of the hard mask layer 130a may be vertical sidewalls.

Figure 6:
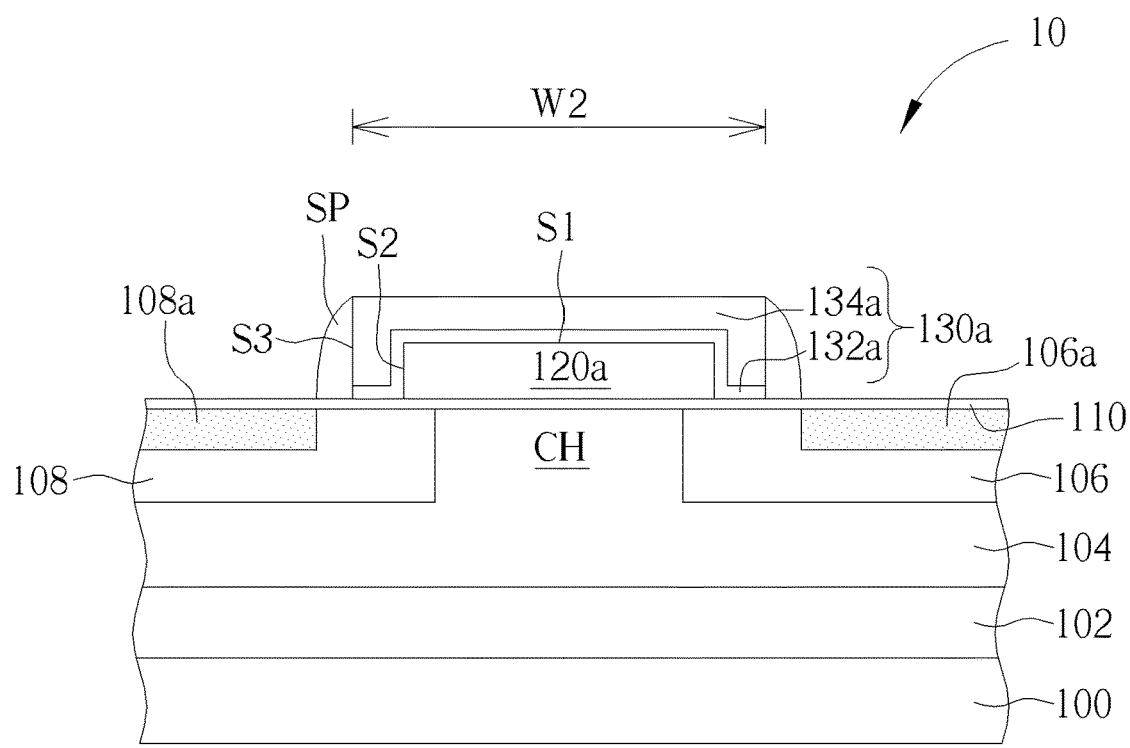

As shown in FIG. 6, next, spacers SP are formed on the two opposite sidewalls S3 of the hard mask layer 130a. According to an embodiment of the present invention, the spacer SP may include a silicon nitride spacer. According to an embodiment of the present invention, the spacer SP may further include a silicon oxide spacer. Next, an ion implantation process is performed to form a first heavily doped region 106a and a second heavily doped region 108a with a second conductivity type in the substrate 100. The first heavily doped region 106a is disposed in the first drift region 106 and adjacent to the spacer SP. The second heavily doped region 108a is disposed within the second drift region 108 and adjacent to the spacer SP. The first heavily doped region 106a is spaced apart from the second heavily doped region 108a.

Structurally, as shown in FIG. 6, the semiconductor device 10 includes a substrate 100 having a first conductivity type (e.g., P-type); a first heavily doped region 106a located in the substrate 100 and having a second conductivity type (e.g., N-type); a second heavily doped region 108a, located in the substrate 100, separated from the first heavily doped region 106a and having the second conductivity type (e.g., N-type); a channel region CH, located in the substrate 100 between the first heavily doped region 106a and the second heavily doped region 108a; a gate 120a, disposed on the channel region CH; a hard mask layer 130a, covering the top surface S1 and sidewall S2 of the gate 120a; and spacers SP, disposed on the sidewalls S3 of the hard mask layer 130a.

According to an embodiment of the present invention, the hard mask layer 130a includes a silicon nitride layer 132a. According to an embodiment of the present invention, for example, the thickness of the silicon nitride layer 132a is 200 angstroms. According to an embodiment of the present invention, the hard mask layer 130a further includes a silicon oxide layer 134a. According to an embodiment of the present invention, for example, the thickness of the silicon oxide layer 134a is 700 angstroms.

According to an embodiment of the present invention, the gate 120a may be a polysilicon gate. According to an embodiment of the present invention, the spacer SP may include a silicon nitride spacer. According to an embodiment of the present invention, the spacer SP further includes a silicon oxide spacer.

According to an embodiment of the present invention, the semiconductor device 10 further includes: a well 104 in the substrate 100 and having a first conductivity type (e.g., P-type); a first drift region 106 disposed in the well 104 and having a second conductivity type conductivity type (e.g., N-type), wherein the first heavily doped region 106a is disposed in the first drift region 106 and adjacent to the spacer SP. A second drift region 108 is disposed in the well 104 and has the second conductivity type (e.g., N-type). The second heavily doped region 108a is disposed within the second drift region 108 and adjacent to the spacer SP.

One feature of the present invention is that the top surface S1 and the sidewall S2 of the gate 120a are covered with the hard mask layer 130a, and then the spacer SP is formed on the sidewall S3 of the hard mask layer 130a. By providing such configuration, the leakage current problem and the GIDL effect caused by the shrinking of the device size and the thinning of the thickness of the spacer SP can be effectively solved.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor device, comprising:
a substrate of a first conductivity type;
a first heavily doped region of a second conductivity type in the substrate;
a second heavily doped region of the second conductivity type spaced apart from the first heavily doped region, located in the substrate;
a channel region in the substrate and between the first heavily doped region and the second heavily doped region;
a gate disposed on the channel region;
a hard mask layer covering a top surface and a sidewall of the gate, wherein the gate is a polysilicon gate, and wherein the hard mask layer is in direct contact with the polysilicon gate, wherein the hard mask layer is a bi-layer structure comprising a silicon nitride lower layer and a silicon oxide upper layer, wherein a sidewall of the silicon nitride lower layer is flush with a sidewall of the silicon oxide upper layer; and
a spacer disposed on a sidewall of the hard mask layer, wherein the spacer is in direct contact with the sidewall of the silicon nitride lower layer and the sidewall of silicon oxide upper layer.

2. The semiconductor device according to claim 1, wherein the silicon nitride lower layer has a thickness of about 200 angstroms.

3. The semiconductor device according to claim 1, wherein the silicon oxide upper layer has a thickness of about 700 angstroms.

4. The semiconductor device according to claim 1, wherein the spacer comprises a silicon nitride spacer.

5. The semiconductor device according to claim 4, wherein the spacer further comprises a silicon oxide spacer.

6. The semiconductor device according to claim 1 further comprising:
a well of the first conductivity type in the substrate;
a first drift region of the second conductivity type disposed in the well, wherein the first heavily doped region is disposed in the first drift region and is in proximity to the spacer; and
a second drift region of the second conductivity type disposed in the well, wherein the second heavily doped region is disposed in the second drift region and is in proximity to the spacer.

7. The semiconductor device according to claim 1, wherein the first conductivity type is P type and the second conductivity type is N type.

8. A method of fabricating a semiconductor device, comprising:
providing a substrate of a first conductivity type;
forming a first heavily doped region of a second conductivity type in the substrate;
forming a second heavily doped region of the second conductivity type spaced apart from the first heavily doped region, in the substrate;
forming a channel region in the substrate and between the first heavily doped region and the second heavily doped region;
forming a gate on the channel region;
forming a hard mask layer covering a top surface and a sidewall of the gate, wherein the gate is a polysilicon gate, and wherein the hard mask layer is in direct contact with the polysilicon gate, wherein the hard mask layer is a bi-layer structure comprising a silicon nitride lower layer and a silicon oxide upper layer, wherein a sidewall of the silicon nitride lower layer is flush with a sidewall of the silicon oxide upper layer; and
forming a spacer on a sidewall of the hard mask layer, wherein the spacer is in direct contact with the sidewall of the silicon nitride lower layer and the sidewall of silicon oxide upper layer.

9. The method according to claim 8, wherein the silicon nitride lower layer has a thickness of about 200 angstroms.

10. The method according to claim 8, wherein the silicon oxide upper layer has a thickness of about 700 angstroms.

11. The method according to claim 8, wherein the spacer comprises a silicon nitride spacer.

12. The method according to claim 11, wherein the spacer further comprises a silicon oxide spacer.

13. The method according to claim 8 further comprising:
forming a well of the first conductivity type in the substrate;
forming a first drift region of the second conductivity type in the well, wherein the first heavily doped region is disposed in the first drift region and is in proximity to the spacer; and
forming a second drift region of the second conductivity type disposed in the well, wherein the second heavily doped region is disposed in the second drift region and is in proximity to the spacer.

14. The method according to claim 8, wherein the first conductivity type is P type and the second conductivity type is N type.

* * * * *